(12) United States Patent
Wu et al.

(10) Patent No.: US 9,640,777 B2
(45) Date of Patent: May 2, 2017

(54) ELECTROLUMINESCENT DEVICES WITH IMPROVED OPTICAL OUT-COUPLING AND EXTERNAL QUANTUM EFFICIENCIES

(71) Applicant: National Taiwan University, Taipei (TW)

(72) Inventors: Chung-Chih Wu, Taipei (TW); Chien-Yu Chen, Taipei (TW); Wei-Kai Lee, Taipei (TW); Hoang Yan Lin, Taipei (TW); Yi-Jiun Chen, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 15/163,100

(22) Filed: May 24, 2016

(65) Prior Publication Data

US 2016/0351847 A1 Dec. 1, 2016

Related U.S. Application Data

(60) Provisional application No. 62/230,129, filed on May 29, 2015.

(51) Int. Cl.
*H01L 29/49* (2006.01)
*H01L 51/52* (2006.01)

(52) U.S. Cl.
CPC ...... *H01L 51/5234* (2013.01); *H01L 51/5209* (2013.01); *H01L 51/5215* (2013.01); *H01L 51/5218* (2013.01); *H01L 51/5225* (2013.01); *H01L 51/5268* (2013.01); *H01L 51/5275* (2013.01)

(58) Field of Classification Search
CPC ............ H01L 51/5234; H01L 51/5209; H01L 51/5215; H01L 51/5225
See application file for complete search history.

(56) References Cited

U.S. PATENT DOCUMENTS

| | | | |
|---|---|---|---|
| 2006/0197438 A1* | 9/2006 | Conley, Jr. ............. | B82Y 20/00 313/503 |
| 2007/0194694 A1* | 8/2007 | Reddy .................... | B82Y 20/00 313/503 |
| 2008/0266642 A1* | 10/2008 | Burrell ................... | B60R 1/088 359/270 |
| 2016/0351847 A1* | 12/2016 | Wu ...................... | H01L 51/5234 |

* cited by examiner

*Primary Examiner* — Michael Shingleton
(74) *Attorney, Agent, or Firm* — WPAT, PC; Justin King

(57) ABSTRACT

An electroluminescent (EL) device is disclosed, comprising a nanostructured composite electrode, one or more functional layers and an top electrode. The nanostructured composite electrode is consisting essentially of a first layer having a nanostructure and a second layer disposed on the nanostructure. The first and second layers are transparent and conducting, and one of the refractive-indexes of the first and second layers is lower than or equal to 1.65, and the other of the refractive-indexes of the first and second layers is higher than or equal to 1.75. One or more functional layers including a light emitting layer is disposed on the second layer. The top electrode is disposed on the functional layers. Especially, each of feature pits and each of intervals between the feature pits of the nanostructure of the first layer is smaller than or equal to a major wavelength of light emitted from the light emitting layer.

19 Claims, 8 Drawing Sheets

I. Nanospheres assembly

II. RIE etching

III. Sputter ITO

IV. Lift-off

V. PEDOT:PSS

VI. Complete device

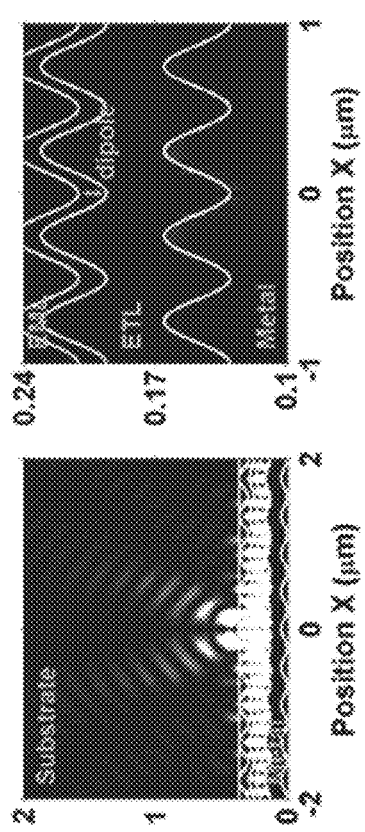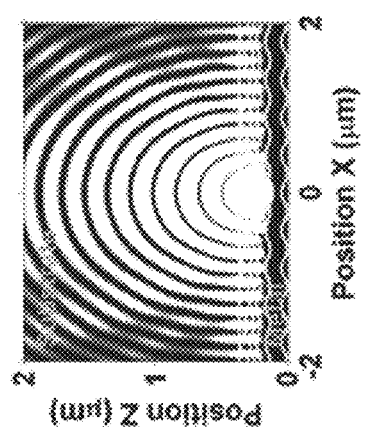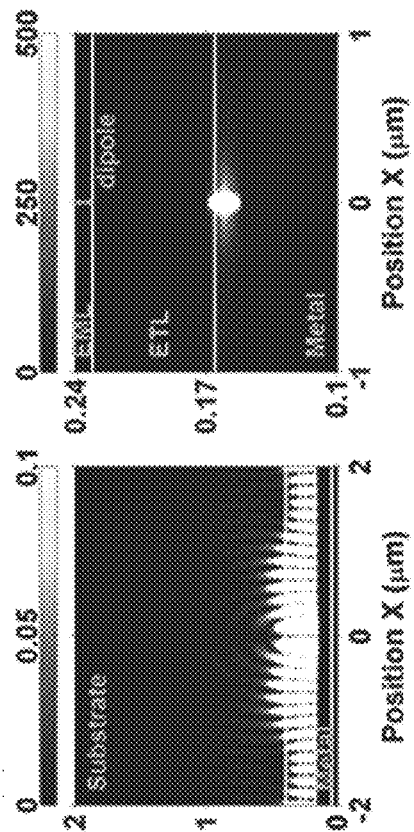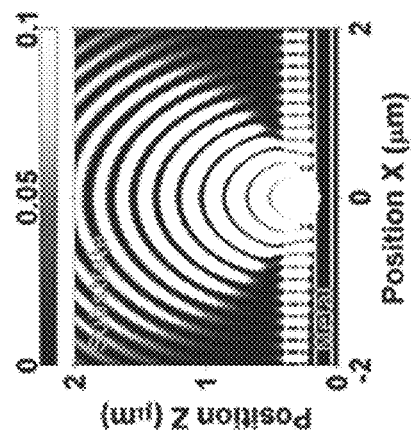
Fig.7a  Fig.7b  Fig.7c  Fig.7d  Fig.7e  Fig.7f

ELECTROLUMINESCENT DEVICES WITH IMPROVED OPTICAL OUT-COUPLING AND EXTERNAL QUANTUM EFFICIENCIES

CROSS-REFERENCE TO RELATED APPLICATION

This application claims priority to and the benefit of U.S. Provisional Patent Application Ser. No. 62/230,129, filed on May 29, 2015, and entitled "Nanostructured Composite Electrodes Containing Regions of Intermeshed High-Index and Low-Index Conductors and Its Applications in Organic Light-Emitting Devices", the disclosure of which is incorporated by reference in its entirety.

FIELD OF THE INVENTION

The present invention pertains to an electroluminescent (EL) device, and more particularly pertains to an organic light-emitting device (OLED) structures with improved optical out-coupling, external quantum efficiencies and their applications.

BACKGROUND OF THE INVENTION

Since reports of efficient and practical organic light-emitting devices (OLEDs) in 1987 by Tang and VanSlyke, OLEDs have been subjects of intensive studies and development for displays and lighting applications. Refer to FIG. 1, a typical OLED has the organic layer(s) sandwiched between one reflective metal electrode (usually cathode) and one transparent indium tin oxide (ITO) electrode (usually anode) on glass substrates. By adopting efficient emitting materials such as the phosphorescence mechanisms, the internal quantum efficiencies of OLEDs can reach nearly 100%. However, in typical OLED structures, the optical out-coupling of OLED internal emission to air is an issue for achieving high external quantum efficiencies. Usually, the ITO and organic layers have higher refractive indices (n) than the typical substrates (e.g., glasses and plastics etc., n~1.4-1.5) and air (n=1), wherein n~1.8-2.1 is for ITO and n~1.7-1.8 is for organic layers in OLEDs. Thus, due to the significant refractive-index mismatches at air/substrate and substrate/ITO interfaces in typical OLEDs, OLED internal emission usually suffers total internal reflection and hence most of internal radiation is trapped and guided inside the device.

In general, internal radiation in OLEDs is coupled into four different modes: "radiation modes" that are outcoupled to air as useful emission; "substrate modes" that are trapped and waveguided in the substrate; "waveguid modes" that are trapped and waveguided in the high-index organic/ITO layers; and, "surface-plasmon (SP) modes" that are guided along the organic/metal interface, as illustrated in FIG. 2. Thus, the out-coupling efficiency of conventional and typical OLED devices is usually only about 20-25%, and there is a great demand in enhancement in external quantum efficiency (EQE) of OLEDs by increasing the light out-coupling, in particular for applications that impose strong requirements on power efficiencies (e.g., lighting and mobile applications etc.).

SUMMARY OF THE PRESENT INVENTION

In order to overcome the drawbacks of prior arts, the present invention provides various embodiments described below.

In certain embodiments, an electroluminescent (EL) device is disclosed, comprising a substrate, a nanostructured composite electrode, one or more functional layers and an top electrode. The nanostructured composite electrode is disposed on the substrate, and the nanostructured composite electrode is consisting essentially of a first layer having a nanostructure and a second layer disposed on the nanostructure. The first and second layers are transparent and conducting, and one of the refractive-indexes of the first and second layers is lower than or equal to 1.65, and the other of the refractive-indexes of the first and second layers is higher than or equal to 1.75. One or more functional layers including a light emitting layer is disposed on the second layer. The top electrode is disposed on the functional layers. Especially, each of feature pits and each of intervals between the feature pits of the nanostructure of the first layer are smaller than or equal to a major wavelength of light emitted from the light emitting layer.

In certain embodiments, the feature pits of the nanostructure comprise nano-meshes, and the width of each of the nano-meshes and each of intervals between the nano-meshes are smaller than a major wavelength of light emitted from the light emitting layer.

In certain embodiments, a difference between the refractive-indexes of the first and second layers is higher than or equal to 0.3.

In certain embodiments, the surface of the second layer, which is closer to the light emitting layer, is flat or corrugated.

In certain embodiments, the top electrode disposed on the functional layer is opaque and reflective, and the energy flux density of the light is coupled into the substrate when the light emitted from the light emitting layer passes through the nanostructured composite electrode.

In certain embodiments, the top electrode disposed on the functional layer is transparent or semi-transparent, and the energy flux density of the light is coupled into the substrate and out of the top electrode disposed on the functional layer in the electroluminescent device. Furthermore, the top electrode disposed on the functional layer is further capped with a superstrate.

In certain embodiments, the top electrode is another nanostructured composite electrode.

In certain embodiments, the number of the functional layer stacked including a light emitting layer is plural, and the electroluminescent device is a tandem device.

BRIEF DESCRIPTION OF THE DRAWINGS

FIG. 7a and FIG. 7b show the x-z-plane cross sections of the energy flux density (i.e., the Poynting vector magnitude) from a y-direction (horizontal) dipole in the conventional planar ITO device and the ITO nanomesh device, respectively.

FIG. 7c and FIG. 7d show the x-z-plane cross section of the energy flux density from a z-direction (vertical) dipole in the conventional planar ITO device and the ITO nanomesh device, respectively.

FIG. 7e and FIG. 7f show the absorption at the metal interfaces in the conventional planar ITO device and the ITO nanomesh device, respectively.

DETAILED DESCRIPTION OF THE INVENTION

It is to be understood that both the foregoing general description and the following detailed description are exemplary and explanatory only and are not restrictive of the invention, as claimed. It should be noted that, as used in the specification and the appended claims, the singular forms "a", "an" and "the" include plural referents unless the context clearly dictates otherwise. The use of the terms "contain", "contains", "containing", "include", "includes", "including," "have," "has," or "having" should be generally understood as open-ended and non-limiting unless specifically stated otherwise. The use of the direction terms "top", "bottom", "on", "under", "up", "down", "left", "right", "front" or "rear", etc. is only reference to the drawings. Thus, the direction is not limited in the present invention. References cited herein are hereby incorporated by reference in their entirety, except to the extent that they conflict with teachings explicitly set forth in this specification.

Figure 1:
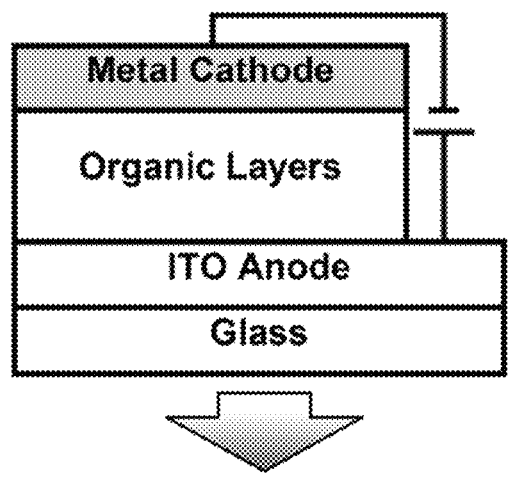
FIG. 1 shows the schematic structure of typical bottom-emitting OLED.
Figure 2:
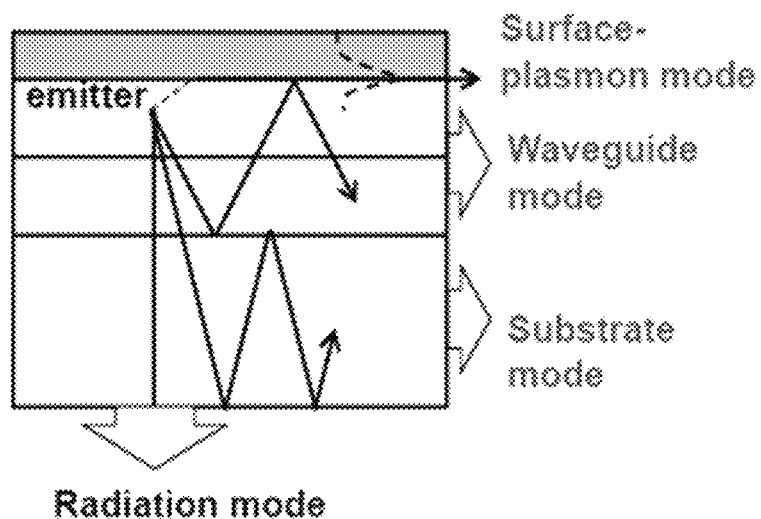
FIG. 2 shows the schematic structure of typical bottom-emitting OLED, which is coupled into four different modes: "radiation modes", "substrate modes", "waveguid modes" and "surface-plasmon (SP) modes".
Figure 3:
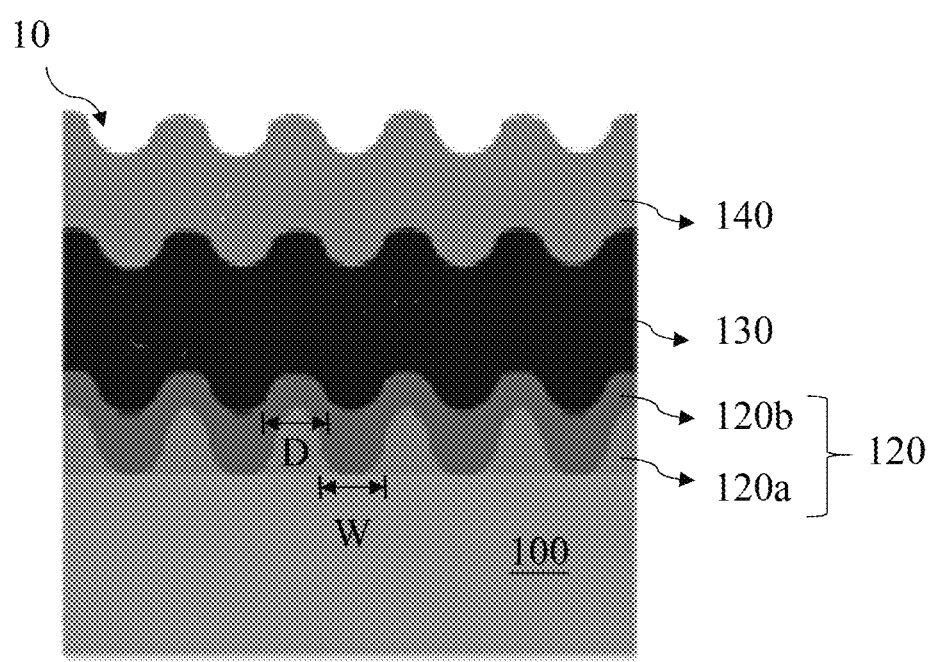
FIG. 3 shows the schematic structure of an electroluminescent (EL) device in the present invention

Please refer to FIG. 3, the present invention discloses an electroluminescent (EL) device 10, hereinafter to be referred as "the ITO nanomesh device", and it can be a light-emitting device (LED) or an organic light-emitting device (OLED). The EL device 10 comprises a substrate 100, a nanostructured composite electrode 120, one or more functional layers 130 and a top electrode 140. The nanostructured composite electrode 120 is disposed on the substrate 100, and the nanostructured composite electrode 120 is consisting essentially of a first layer 120a having a nanostructure and a second layer 120b disposed on the nanostructure wherein the first and second layers 120a-120b are transparent and conducting, and one of the refractive-indexes of the first and second layers is lower than or equal to 1.65, and the other of the refractive-indexes of the first and second layers is higher than or equal to 1.75. One or more functional layers 130, such as organic layers, including a light emitting layer is disposed on the second layer 120b. The top electrode 140 is disposed on the functional layers 130. Especially, each of feature pits W and each of intervals D between the feature pits W of the nanostructure of the first layer 120a are smaller than or equal to a major wavelength of light emitted from the light emitting layer. In an advantageous embodiment, the feature pits of the nanostructure comprise nano-meshes, and the width of each of the nano-meshes and each of intervals between the nano-meshes are smaller than a major wavelength of light emitted from the light emitting layer.

This invention provides a nanostructured composite electrode 120 containing regions of intermeshing a high-refractive-index (preferably n>1.75) transparent conductor 120a and another low-refractive-index (preferably n<1.65) transparent conductor 120b to the nano-scale (wavelength-scale). In a preferred embodiment, a difference between the refractive-indexes of the first layer 120a and second layer 120b is higher than or equal to 0.3. The surface of the second layer 120b, which is closer to the light emitting layer, is flat or corrugated; thus, the nanostructured composite electrode 120 may have a flat top surface or have a corrugated top surface. This nanostructured composite electrode 120 can be used as the electrode of an organic light-emitting device (OLED) to improve light out-coupling. With such nanostructured composite electrode, the coupling efficiencies of OLED internal emission into air and into substrate are substantially increased over those of OLEDs using typical transparent electrode. Such OLEDs can be disposed over a substrate comprising no out-coupling surface treatment or over a substrate comprising an out-coupling surface treatment. Enhanced light out-coupling and external quantum efficiency can be obtained from such OLED structures on substrates comprising no out-coupling surface treatment, and even higher light out-coupling and external quantum efficiency can be obtained from such OLED structures on substrates comprising an out-coupling surface treatment.

Embodiment of Invention—Example 1

In one possible embodiment of this invention, the transparent electrode material ITO which has a relatively high refractive index (n~1.8-2.1) could be used as the high-index component of the composite electrode 120a, while transparent high-conductivity conducting polymer poly (3,4-ethylenedioxythiophene):poly(styrenesulfonate) (PEDOT:PSS), which has a relatively low refractive index (n~1.5) could be used as the low-index component of the composite electrode 120b. ITO and PEDOT:PSS may be judiciously combined to form conducting photonic nanostructures for both current conduction and benefiting OLED efficiencies. In this first possible embodiment of the composite electrode is realized by formation of an ITO nanomesh 120a and its filling/coverage by high-conductivity PEDOT:PSS 120b. Overcoating the ITO nanomesh 120a with conductive PEDOT:PSS 120b can partially planarize the ITO nanomesh surface for OLED device integration and extend the light emission areas to regions without ITO, yet still giving the desired index modulation. Making use of their very different refractive indices and incomplete planarization of the ITO nanomesh by PEDOT:PSS, such an internal extraction structure indeed combines structural characteristics of both photonic crystals and surface corrugation. Please refer to FIG. 3a, this structure can be readily fabricated by facile nanosphere lithography (of ITO) and spin-coating (of PEDOT:PSS). Since both ITO and PEDOT:PSS are transparent and conducting, it can be directly used as the nanostructured composite electrode for OLEDs and ensure uniform emission over the whole device area. By combining this internal extraction structure and the external extraction scheme (e.g. by attaching extraction lens), a very high EQE of nearly 62% was achieved with a green phosphorescent OLED.

Figure 3A:
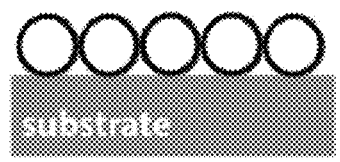
FIG. 3a shows the fabrication flow of an electroluminescent (EL) device in the present invention.
Figure 3A:
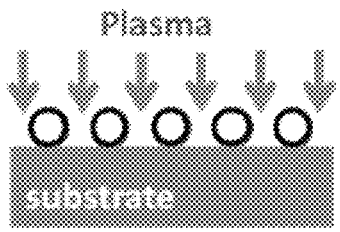
Figure 3A:
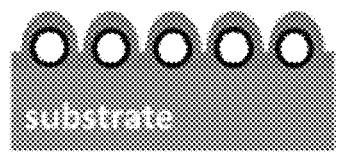
Figure 3A:
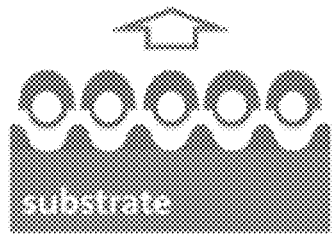
Figure 3A:
Figure 3A:
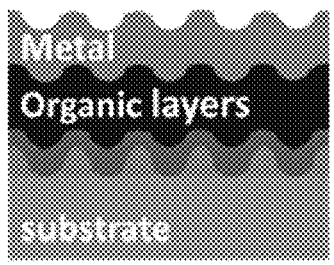
Figure 3B:
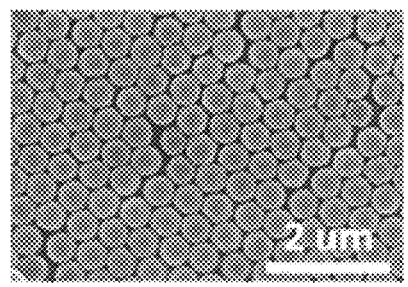
FIG. 3b, FIG. 3c and FIG. 3d show the SEM (scanning electron microscopy) images of the resulted nanosphere monolayer, the shrunk PS nanospheres and the ITO nanomesh
Figure 3C:
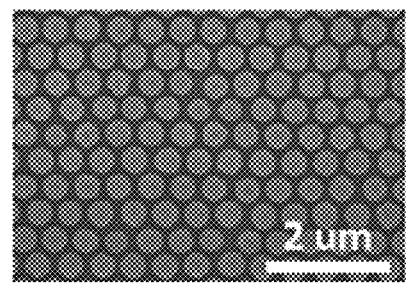
Figure 3D:
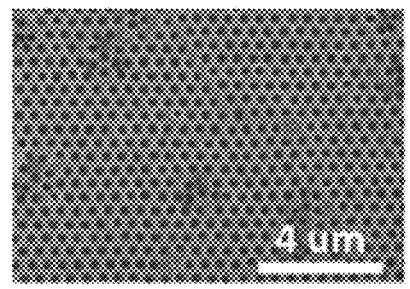

FIG. 3a schematically illustrates the fabrication of the ITO nanomesh, the ITO nanomesh/PEDOT:PSS composite electrode and the complete OLED on such electrodes. In the step I, the spin-coating in combination with the water transfer technique was adopted to produce large-area and close-packed (hexagonal) self-assembly monolayer (SAM) of polystyrene (PS) latex nanospheres (with an average diameter of 500 nm, Duke Scientific 5050A) on the glass substrate. FIG. 3b shows the SEM (scanning electron microscopy) image of the resulted nanosphere monolayer. In the step II, the size of PS nanospheres was then shrunk to ~270 nm by oxygen plasma etching, as shown by SEM image in FIG. 3c. In the step III, the conductive ITO layer (~70 nm thick) was then deposited through PS nanospheres by RF sputtering at room temperature. An ITO layer thus deposited in general gave a conductivity of ~1800 S/cm. In the step IV, the ITO nanomesh was then formed by lifting off PS nanospheres, as shown by the SEM image in FIG. 3d. Subsequently, in the step V, a high conductivity PEDOT:PSS layer (for lateral conduction) and a low-conductivity PEDOT:PSS layer (for hole injection) was sequentially spin-coated over the ITO nanomesh, followed by annealing at 130° C. for 15 min after each coating. In the step VI, further deposition of the organic layers stack and the metal electrode onto the ITO nanomesh/PEDOT:PSS composite electrode by thermal evaporation completed the whole OLED device.

In the step V, low-conductivity PEDOT:PSS was spin-coated from the as-purchased aqueous solution (Clevios, Heraeus Co.), while high-conductivity PEDOT:PSS was spin-coated from a mixture of the as-purchased aqueous solution and 7.5 vol. % dimethyl sulfoxide (DMSO). Adding DMSO as polar co-solvent into the PEDOT:PSS had been reported to substantially increase the conductivity of PEDOT:PSS. With DMSO addition, the spin-coated PEDOT:PSS films in general gave a conductivity of 900-1000 S/cm, orders of magnitude higher than that (~0.1 S/cm) of PEDOT:PSS films coated from original (as purchased) aqueous solutions. High-conductivity and low-conductivity PEDOT:PSS films deposited on flat surfaces by similar conditions (6000 rpm, 40 sec.) in general gave thicknesses of ~65 nm and ~20 nm, respectively.

Figures 4A, 4B, 4C:
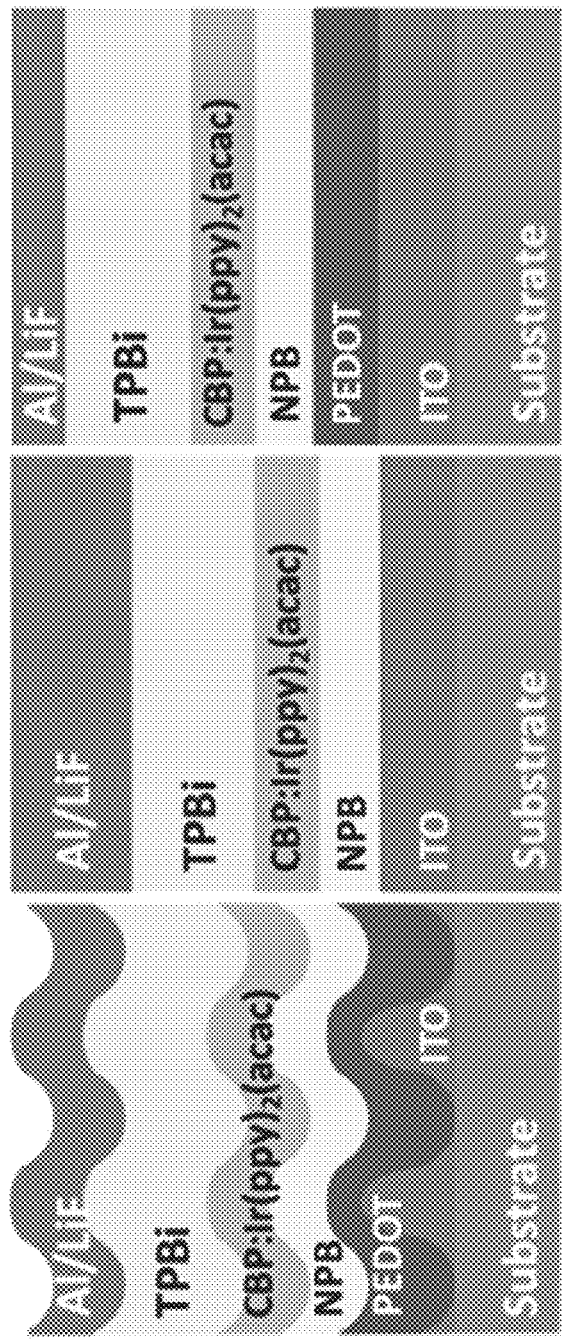
FIG. 4a, FIG. 4b and FIG. 4c show the schematic device structures of the ITO nanomesh device, the planar ITO device, and the planar ITO/PEDOT device.

As shown in FIG. 4a, the OLED stack on top of the composite electrode had the typical structure of green phosphorescent OLEDs:

Glass substrate/anode (ITO nanomesh/PEDOT:PSS composite electrode)/NPB (40 nm)/CBP:Ir(ppy)$_2$(acac) 8 wt. % (15 nm)/TPBi (65 nm)/LiF (0.5 nm)/Al (130 nm).

NPB(N,N'-Di(1-naphthyl)-N,N'-diphenyl-(1,1'-biphenyl)-4,4'-diamine) served as the hole transport layer. CBP [4,4'-bis(carbazol-9-yl) biphenyl] doped with 8 wt. % Ir(ppy)$_2$(acac) [bis(2-phenylpyridine)(acetylacetonato) iridium(III)] was the phosphorescent green emitting layer. TPBi (2,2',2"-(1,3,5-Benzinetriyl)-tris(1-phenyl-1-H-benzimidazole)) was used as the electron transport layer. LiF and Al were the electron injection layer and the cathode, respectively. The active area of devices was 1 mm$^2$ as defined by in-situ shadow masking. The thicknesses of organic layers used were typical values for OLEDs.

Please refer to FIG. 4b and FIG. 4c, two reference devices having same organic layer structures except for using the planar ITO anode (~100 nm), which is formed a planar ITO device, and using the planar ITO/PEDOT:PSS anode (~100 nm ITO/65 nm high-conductivity PEDOT:PSS/20 nm low-conductivity PEDOT:PSS), which is formed a planar ITO/PEDOT device, were also fabricated and tested for comparison. In addition to electroluminescence (EL) characterization of as-fabricated devices, to extract and collect overall radiation coupled into substrates, these devices were also characterized when further attached with a relatively large hemisphere glass lens (having a diameter of 1 cm) using the index-matching oil. To collect total emission fluxes and to determine EQEs of various devices, a calibrated integrating-sphere measurement system was used. EQEs thus determined were also verified by those determined from measured angular dependence of EL spectra and intensities.

Figures 5A, 5B:
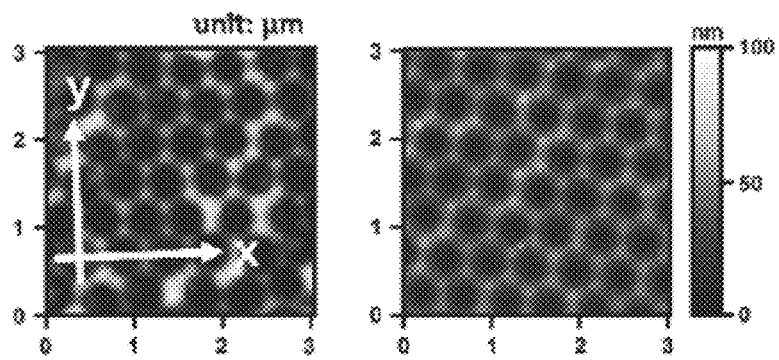
FIG. 5a shows the topographic surface images taken by AFM (atomic force microscopy) with the ITO nanomesh only during sequential deposition of layers onto the ITO nanomesh.
FIG. 5b shows the topographic surface images taken by AFM after the PEDOT:PSS coating during sequential deposition of layers onto the ITO nanomesh.
Figures 5C, 5D:
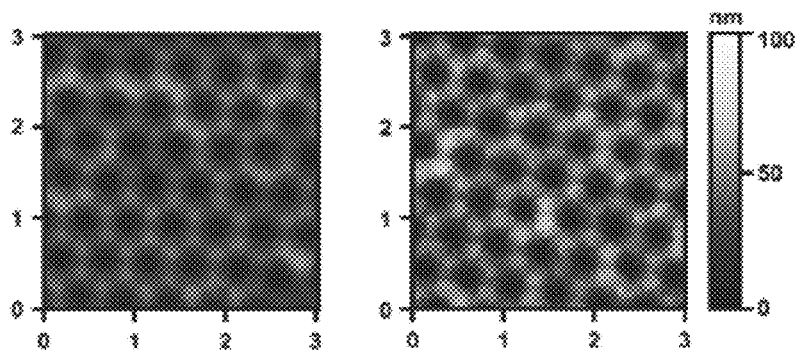
FIG. 5c shows the topographic surface images taken by AFM after deposition of all OLED organic layers during sequential deposition of layers onto the ITO nanomesh.
FIG. 5d shows the topographic surface images taken by AFM after deposition of the metal cathode during sequential deposition of layers onto the ITO nanomesh.
Figure 5E:
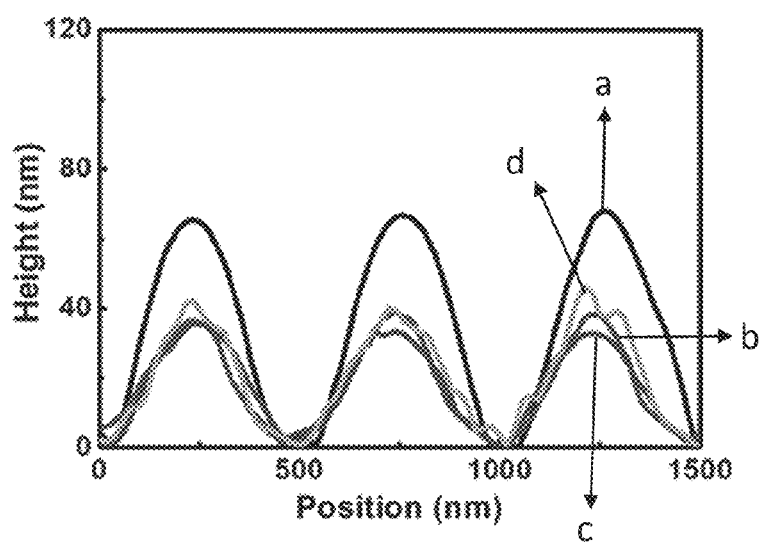
FIG. 5e shows the surface profiles taken along the x direction (as defined in FIG. 5a) for each of FIG. 5a-5d.

FIG. 5a-5d show topographic surface images taken by AFM (atomic force microscopy) during sequential deposition of layers onto the ITO nanomesh, respectively, (a) with the ITO nanomesh only (shown as FIG. 5a and curve a in FIG. 5e), (b) after the PEDOT:PSS coating (shown as FIG. 5b and curve b in FIG. 5e), (c) after deposition of all OLED organic layers (shown as FIG. 5c and curve c in FIG. 5e), and (d) after deposition of the metal cathode (shown as FIG. 5d and curve d in FIG. 5e). FIG. 5e shows the surface profiles taken along the x direction (as defined in FIG. 5a) for each of FIG. 5a-5d. In FIG. 5e, except for an initial reduction of the corrugation height from ~70 nm (shown as curve a) to ~35-40 nm (shown as curve b) by coating PEDOT:PSS onto the ITO nanomesh, further vacuum deposition of layers was roughly conformal and a corrugation height of ~35-40 nm was retained (shown as curve c and curve d). It is concluded that the PEDOT:PSS coating here does not completely planarize the ITO nanomesh, and that combination of the ITO nanomesh and PEDOT:PSS coverage gives both index modulation and surface corrugation.

Figure 6A:
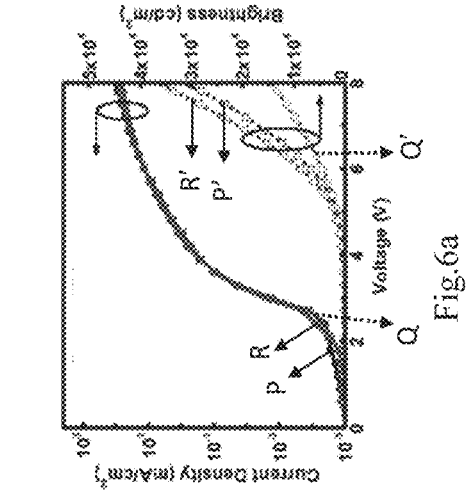
FIG. 6a shows the current-voltage-luminance (I-V-L) characteristics of the ITO nanomesh device, the planar ITO device, the planar ITO/PEDOT device (without lens attachment).
Figure 6B:
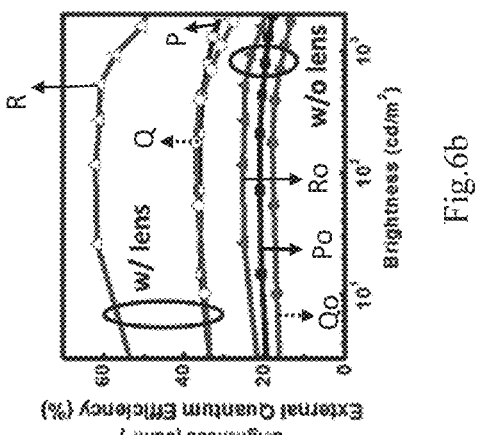
FIG. 6b and FIG. 6c show the EQEs and luminous efficiencies of said three devices.
Figure 6C:
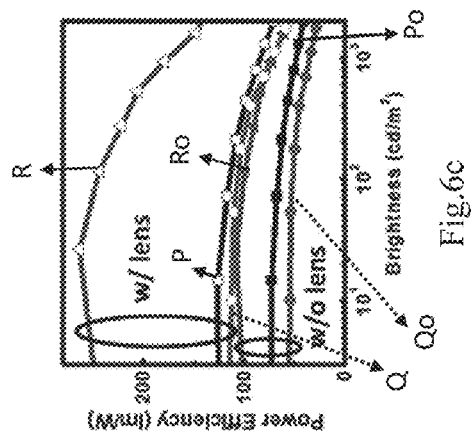

FIG. 6a shows the current-voltage-luminance (I-V-L) characteristics of the ITO nanomesh device in the embodiment of the present invention, the conventional planar ITO device, the conventional planar ITO/PEDOT device (without lens attachment). Curve R and R' represent I-V and L-V characteristics of the ITO nanomesh device respectively; curve P and P' represent I-V and L-V characteristics of the planar ITO device respectively; and, curve Q and Qo represent I-V and L-V characteristics of the planar ITO/PEDOT device respectively. They all show well-behaved and similar I-V characteristics. The difference in emission characteristics between the ITO nanomesh device and the conventional planar ITO device can be mainly attributed to their different optical structures, not due to insertion of PEDOT:PSS. FIG. 6b and FIG. 6c show the EQEs and luminous efficiencies of these devices without or with attaching extraction lens, which are also summarized in Table 1. With lens attachment (w/lens), Curve R represents the ITO nanomesh device, curve P represents the planar ITO device, and curve Q represents the planar ITO/PEDOT device. Without lens attachment (w/o lens), Curve Ro represents the ITO nanomesh device, curve Po represents the planar ITO device, and curve Qo represents the planar ITO/PEDOT device.

TABLE 1

The summary of efficiencies of OLED devices.

|  |  | Planar ITO | Planar ITO/PEDOT | ITO nanomesh |
|---|---|---|---|---|
| EQE (%) | w/o lens | 21.0 | 18.0 | 25.3 |
|  | w/lens | 36.2 | 37.0 | 61.9 |
| Power efficiency (lm W$^{-1}$) | w/o lens | 73.2 | 56.5 | 107.9 |
|  | w/lens | 126.0 | 116.3 | 264.3 |

Without lens attachment, the planar ITO, planar ITO/PEDOT, and ITO nanomesh devices exhibit EQE and power efficiency of up to (21.0%, 73.2 lm/W), (18.0%, 56.5 lm/W), and (25.3%, 107.9 lm/W), respectively. Compared to the conventional planar ITO device, a moderate enhancement in EQE (~1.2 X) is obtained with the ITO nanomesh/PEDOT:PSS composite electrode. The lower efficiency of the planar ITO/PEDOT device clearly indicates such efficiency enhancement is not from insertion of PEDOT:PSS, but more associated with the photonic nanostructures embedded. Most importantly, the EQE enhancement is even more dramatic when combining the nanostructured composite electrode with the external extraction scheme (e.g., attachment of extraction lens). With attaching large hemisphere lenses, all the planar ITO, planar ITO/PEDOT, and ITO nanomesh devices exhibit much enhanced EQE and power efficiency of up to (36.2%, 126.0 lm/W), (37.0%, 116.3 lm/W), and (61.9%, 264.3 lm/W), respectively, due to effective extraction of radiation entering substrates.

Figure 6D:
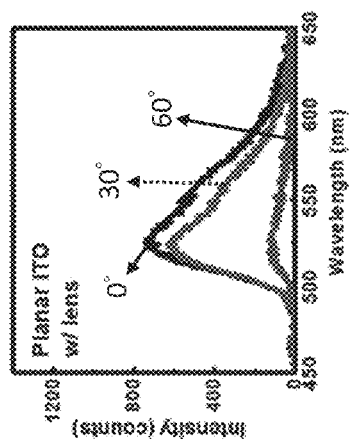
FIG. 6d and FIG. 6e show measured EL spectra with relative intensities at viewing angles of 0°, 30°, and 60° off the surface normal for the lens-attached planar ITO device and the ITO nanomesh device, respectively.
Figure 6E:
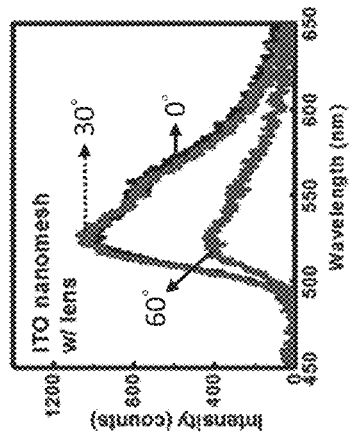
Figure 6F:
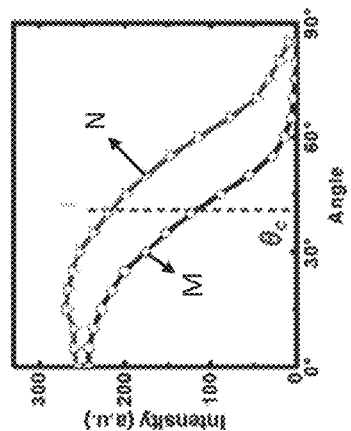
FIG. 6f shows the spectrally integrated EL intensity (with lens attachment) as a function of the viewing angle.

Intriguingly one notices that the EQE enhancement by lens attachment is significantly larger for the ITO nanomesh device than for the conventional planar ITO device (61.9%/25.3%=2.4 5X vs. 36.2%/21.0%=1.72 X) and that the EQE gain of the ITO nanomesh device relative to the planar ITO device is also enhanced with lens attachment (61.9%/36.2%=1.71 X after lens attachment vs. 25.3%/21.0%=1.2 X before lens attachment). Since attaching the large hemisphere lens helps to extract radiation initially outside the escape cone in the substrate (i.e., flux beyond the critical angle θc~41° of the glass-air interface), all these suggest that the configuration of the ITO nanomesh device indeed substantially enhances coupling of internally generated radiation into the substrate (than the conventional planar ITO device) and yet a significant portion of such fluxes falls beyond the critical angle. This is indeed confirmed by the angle-resolved EL characteristics of both devices with lens attachment. FIG. 6d and FIG. 6e show measured EL spectra with relative intensities at viewing angles of 0°, 30°, and 60° off the surface normal for the lens-attached planar ITO device and the ITO nanomesh device, respectively. FIG. 6f shows the spectrally integrated EL intensity as a function of the viewing angle for both cases. Curve M represents the planar ITO device, and Curve N represents the ITO nanomesh device. A significantly enhanced contribution from fluxes beyond the critical angle of the glass-air interface (when integrating fluxes over solid angles) is clearly seen in the ITO nanomesh device compared to conventional planar ITO device.

To get more insights of how the ITO nanomesh device configuration enhances coupling of internally generated light into the substrate and air, optical simulation was conducted by combining the three-dimensional finite difference time domain simulation (FDTD, Rsoft 9.0 FullWave, Synosys Inc.) for near-field behaviors near the active region and the ray-tracing simulation (LightTools 8.2, Synosys Inc.) for far-field behaviors in the substrate and air. The FDTD analyses were conducted by locating emitting dipoles of different orientations (i.e., along x, y, z directions; x and y directions are as defined in FIG. 5a, and z direction is along the substrate surface normal) and frequencies in the emitting layer over unit cells of the hexagonal lattice. FIG. 7a and FIG. 7b show the x-z-plane cross sections of the energy flux density (i.e., the Poynting vector magnitude) from a y-direction (horizontal) dipole in the conventional planar ITO device and the ITO nanomesh device of the present invention, respectively. In the conventional planar ITO device, a substantial amount of radiation is confined and propagates laterally in organic/ITO layers, while in the ITO nanomesh device, the radiation confined in ITO/organic layers is reduced and more radiation is directed toward the substrate (and thus air). As consistent with experiments, in the ITO nanomesh device of the present invention, a significant portion of radiation coupled to the substrate is into larger angles, that would not be out-coupled to air directly (due to total internal reflection) but could be effectively extracted by external schemes (like attaching extraction lens here). For the z-direction (vertical) dipole, its radiation is mostly laterally confined to ITO/organic waveguiding modes or the metal SPP modes in conventional planar device configurations, as seen in the x-z-plane cross section of the energy flux density shown in FIG. 7c. Again the ITO nanomesh device configuration helps to couple some of these otherwise confined modes into the substrate, as seen in the x-z plane cross section of the energy flux density shown in FIG. 7d. It also significantly reduces SPP losses for radiation from the z-direction (vertical) dipole, as evident by comparing the absorption at the metal interfaces shown in FIG. 7e and FIG. 7f for the planar ITO device and the ITO nanomesh device, respectively.

In FIG. 7e and FIG. 7f, the absorption at the metal interfaces is defined as $A(r', t_s) = \omega \times Im[\varepsilon] \times |E(r', t_s)|^2$, where $\omega$ is the frequency, $Im[\varepsilon]$ is the imaginary part of the dielectric permittivity, $|E(r', t_s)|^2$ is the intensity of the electric field at the position r' and specific time $t_s$. Enhanced coupling of internal radiation into the substrate and reduced SPP losses at the metal interface can be attributed to the fact that the index modulation and corrugation induced by the ITO nanomesh/PEDOT:PSS composite electrode provide additional wave vectors for some of otherwise confined waves (guided waves and surface waves) to match/satisfy momentum conservation and be coupled into leaky (escapable) waves. Indeed the calculated coupling efficiency (~64%) of internally generated radiation into the substrate is close to the measured EQE (61.9%) for the lens-attached ITO nanomesh device.

In summary, this embodiment provides a nanostructured composite electrode consisting of the ITO nanomesh and high-conductivity conducting polymer PEDOT:PSS, that can be facilely fabricated by nanosphere lithography and spin-coating, for enhancing light extraction of OLEDs. Making use of their very different refractive indices and incomplete planarization of the ITO nanomesh by PEDOT:PSS, such a conductive photonic nanostructure combines characteristics of photonic crystals and surface corrugation. It effectively enhances coupling of internal radiation into the substrate, in addition to functioning as the current conductor/injector. By combining this internal extraction structure and the external extraction scheme (e.g. by attaching extraction lens), a very high EQE of nearly 62% was achieved with a green phosphorescent OLED.

Embodiment of Invention—Example 2

Following the general principles of the preceding embodiment example, there could be different variations and modifications of the embodiment. For instance, instead of forming the nanomesh of the high refractive index (n~1.8-2.1) transparent conductor first like in Example 1, one may also form the nanomesh of the low refractive index (n~1.5) transparent conductor first and then over-coat/fill it with the high refractive index (n~1.8-2.1) transparent conductor, so as another nanostructured composite electrode is formed.

Embodiment of Invention—Example 3

Following the general principles of the preceding embodiment example, there could be different variations and modifications of the embodiment. For instance, the higher refractive-index transparent electrode, which is ITO, in Example 1 and Example 2 may be replaced by other high-refractive-index (preferably n>1.75) transparent conductor. The higher refractive-index material of the first and second layers comprises a high refractive-index transparent conducting oxide, and the high refractive-index transparent conducting oxide is such as indium tin oxide (ITO), fluorine-doped tin oxide, aluminum zinc oxide, gallium zinc oxide, indium zinc oxide, tin oxide, titanium niobium oxide, titanium oxide, their combinations, and their stacking.

Embodiment of Invention—Example 4

Following the general principles of the preceding embodiment example, there could be different variations and modifications of the embodiment. For instance, the lower-index conducting layer, which is PEDOT:PSS, in Example 1 and Example 2 may be replaced with other solution-coated or vacuum-deposited conducting materials having a low-refractive-index (preferably n<1.65) transparent conductor significantly lower than those of the high-index transparent conductors. Examples include solution-processed or vacuum-deposited nanoporous transparent conductors like nanoporous fluorine-doped tin oxide, aluminum zinc oxide, gallium zinc oxide, indium zinc oxide, tin oxide, titanium oxide, titanium niobium oxide, their combinations, their stacking, and others similar materials.

Embodiment of Invention—Example 5

For instance, an out-coupling lens attached to the substrate in the preceding example may be replaced with other out-coupling surface treatment, such as attaching a prism, attaching a pyramid, attaching a micro-lens sheet, attaching a micro-prism sheet, attaching a micro-pyramid sheet, attaching a micro-particle layer, attaching a nano-particle layer, attaching a grating sheet, attaching a scattering sheet, attaching a diffuser sheet etc.

Embodiment of Invention—Example 6

For instance, an out-coupling lens attached to the substrate in the preceding example may be replaced with other out-coupling surface treatment, such as roughening the outer surface, scattering the outer surface and shaping the outer surface to form prism, pyramid, micro-lens, micro-prism, micro-pyramid and grating.

Embodiment of Invention—Example 7

For instance, the EL device 10 in Example 1 may be "inverted", i.e. the bottom nanostructured composite electrode 120 serving as the cathode instead and the top metal electrode 140 serving as the anode.

Embodiment of Invention—Example 8

For instance, the EL device 10 in Example 1 is a tandem device; i.e. the functional layer 130 is composed of several light emitting layer stacking vertically through some electrical connecting structure.

Embodiment of Invention—Example 9

In certain embodiments, the top electrode 140 disposed on the functional layer is opaque and reflective, and the energy flux density of the light is coupled into the substrate 100 when the light emitted from the light emitting layer passes through the nanostructured composite electrode 120.

Embodiment of Invention—Example 10

In certain embodiments, the top electrode 140 disposed on the functional layer is transparent or semi-transparent, and the energy flux density of the light is coupled into the substrate and out of the top electrode disposed on the functional layer in the electroluminescent device. Furthermore, the top electrode disposed on the functional layer is further capped with a superstrate. For instance, an out-coupling lens attached to the superstrate, and the out-coupling lens includes a prism, a pyramid, a micro-lens sheet, a micro-prism sheet, a micro-pyramid sheet, a micro-particle layer, a nano-particle layer, a grating sheet, a scattering sheet and a diffuser sheet. For instance, the superstrate has an outer surface opposite to the top electrode, and the outer surface is treated with surface treatment to form an out-coupling len, such as roughening the outer surface, scattering the outer surface and shaping the outer surface to form prism, pyramid, micro-lens, micro-prism, micro-pyramid and grating.

Embodiment of Invention—Example 11

In certain embodiments, the top electrode is another nanostructured composite electrode; i.e. the bottom nanostructured composite electrode serving as the anode and the top nanostructured composite electrode serving as the cathode.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. An electroluminescent (EL) device, comprising:
a nanostructured composite electrode, that is consisting essentially of a first layer having a nanostructure and a second layer disposed on the nanostructure,
wherein the first and second layers are transparent and conducting, and one of the refractive-indexes of the first and second layers is lower than or equal to 1.65, and the other of the refractive-indexes of the first and second layers is higher than or equal to 1.75;
one or more functional layers including a light emitting layer, disposed on the second layer; and
an top electrode, disposed on the functional layers;
wherein each of feature pits and each of intervals between the feature pits of the nanostructure of the first layer are smaller than or equal to a major wavelength of light emitted from the light emitting layer.

2. The electroluminescent device of claim 1, wherein the feature pits of the nanostructure comprise nano-meshes, and the width of each of the nano-meshes and each of intervals between the nano-meshes are smaller than a major wavelength of light emitted from the light emitting layer.

3. The electroluminescent device of claim 1, wherein a difference between the refractive-indexes of the first and second layers is higher than or equal to 0.3.

4. The electroluminescent device of claim 1, wherein the higher refractive-index material of the first and second layers comprises a high refractive-index transparent conducting oxide, and the high refractive-index transparent conducting oxide is selected from the group consisting of indium tin oxide (ITO), fluorine-doped tin oxide, aluminum zinc oxide, gallium zinc oxide, indium zinc oxide, tin oxide, titanium niobium oxide, titanium oxide, their combination, and their stacking.

5. The electroluminescent device of claim 1, wherein the lower refractive-index material of the first and second layers includes a low refractive-index nanoporous transparent conducting oxide or a low refractive-index conducting polymer, and the low refractive-index nanoporous transparent conducting oxide is selected from the group consisting of indium tin oxide (ITO), fluorine-doped tin oxide, aluminum zinc oxide, gallium zinc oxide, indium zinc oxide, tin oxide, titanium niobium oxide, titanium oxide, their combination, and their stacking.

6. The electroluminescent device of claim 1, wherein the surface of the second layer, which is closer to the light emitting layer, is flat or corrugated.

7. The electroluminescent device of claim 1, further comprising a substrate adjacent to the nanostructured composite electrode and opposite to the functional layers, wherein the substrate has an outer surface opposite to the nanostructured composite electrode, and the outer surface is treated with surface treatment to form an out-coupling lens.

8. The electroluminescent device of claim 7, wherein the surface treatment includes roughening the outer surface, scattering the outer surface and shaping the outer surface to form prism, pyramid, micro-lens, micro-prism, micro-pyramid and grating.

9. The electroluminescent device of claim 1, further comprising a substrate adjacent to the nanostructured composite electrode and opposite to the functional layers, wherein an out-coupling lens attached to the substrate, and the out-coupling lens includes a prism, a pyramid, a micro-lens sheet, a micro-prism sheet, a micro-pyramid sheet, a micro-particle layer, a nano-particle layer, a grating sheet, a scattering sheet and a diffuser sheet.

10. The electroluminescent device of claim 1, wherein the top electrode disposed on the functional layer is opaque and reflective.

11. The electroluminescent device of claim 10, wherein the energy flux density of the light is coupled into the substrate when the light emitted from the light emitting layer passes through the nanostructured composite electrode.

12. The electroluminescent device of claim 1, wherein the top electrode disposed on the functional layer is transparent or semi-transparent.

13. The electroluminescent device of claim 12, wherein the energy flux density of the light is coupled into the substrate and out of the top electrode disposed on the functional layer in the electroluminescent device.

14. The electroluminescent device of claim 12, wherein the top electrode disposed on the functional layer is further capped with a superstrate.

15. The electroluminescent device of claim 14, wherein the superstrate has an outer surface opposite to the top electrode, and the outer surface is treated with surface treatment to form an out-coupling lens.

16. The electroluminescent device of claim 15, wherein the surface treatment comprises roughening the outer surface, scattering the outer surface and shaping the outer surface to form prism, pyramid, micro-lens, micro-prism, micro-pyramid and grating.

17. The electroluminescent device of claim 14, further comprising an out-coupling lens attached to the superstrate, and the out-coupling lens includes a prism, a pyramid, a micro-lens sheet, a micro-prism sheet, a micro-pyramid sheet, a micro-particle layer, a nano-particle layer, a grating sheet, a scattering sheet and a diffuser sheet.

18. The electroluminescent device of claim 1, wherein the top electrode is another said nanostructured composite electrode.

19. The electroluminescent device of claim 1, wherein the number of the functional layer stacked including a light emitting layer is plural, and the electroluminescent device is a tandem device.

* * * * *